(12) United States Patent
Miyasaka

(10) Patent No.: US 6,958,201 B2
(45) Date of Patent: Oct. 25, 2005

(54) ELECTRON BEAM EXPOSURE MASK, ELECTRON BEAM EXPOSURE METHOD, METHOD OF FABRICATING SEMICONDUCTOR DEVICE, AND ELECTRON BEAM EXPOSURE APPARATUS

(75) Inventor: Mami Miyasaka, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 52 days.

(21) Appl. No.: 10/657,288

(22) Filed: Sep. 8, 2003

(65) Prior Publication Data

US 2004/0048169 A1 Mar. 11, 2004

Related U.S. Application Data

(62) Division of application No. 09/641,125, filed on Aug. 16, 2000, now Pat. No. 6,645,676, and a division of application No. 10/657,429, filed on Aug. 16, 2000.

(30) Foreign Application Priority Data

Aug. 19, 1999 (JP) .......................................... 11-232358

(51) Int. Cl.$^7$ ................................................. G03F 9/00
(52) U.S. Cl. ............................................................. 430/5
(58) Field of Search ....................... 430/5, 296; 378/34, 378/35

(56) References Cited

U.S. PATENT DOCUMENTS

| 5,885,747 A | 3/1999 | Yamasaki et al. |
| 6,090,527 A | 7/2000 | Yamazaki et al. |
| 6,180,289 B1 | 1/2001 | Hirayanagi |

*Primary Examiner*—Saleha R. Mohamedulla
(74) *Attorney, Agent, or Firm*—Katten Muchin Zavis Rosenman

(57) ABSTRACT

An electron beam exposure mask comprises a main mask and one or more compensation masks. The main mask has a plurality of first defined masks. The compensation mask includes one or more non-defective second defined masks each having a pattern configuration to be formed in a defective among said first defined masks. In performing exposures by using this electron beam exposure mask, first defined masks are used as long as the first defined masks are non-defective, and the second defined mask corresponding to a first defined mask is used when the first defined mask is defective.

7 Claims, 9 Drawing Sheets

ELECTRON BEAM EXPOSURE MASK, ELECTRON BEAM EXPOSURE METHOD, METHOD OF FABRICATING SEMICONDUCTOR DEVICE, AND ELECTRON BEAM EXPOSURE APPARATUS

CROSS-REFERENCE TO RELATED APPLICATIONS

This is a Divisional Application of application Ser. No. 09/641,125, filed on Aug. 16, 2000, U.S. Pat. No. 6,645,676. Another Divisional Application of application Ser. No. 09/641,125, Application Ser. No. 10/657,429, was file concurrently with this application.

BACKGROUND OF THE INVENTION

1. Field of the Invention

The invention relates to an electron beam exposure mask (hereinafter, referred to as exposure mask) for use in irradiating a wafer with an electron beam for cell projection, an electron beam exposure method using the same, a method of fabricating a semiconductor device, and an electron beam exposure apparatus. In particular, the invention relates to an electron beam exposure mask, an electron beam exposure method, a method of fabricating a semiconductor device, and an electron beam exposure apparatus for improved yield.

2. Description of the Related Art

Conventionally, techniques of variable shaping and partial cell projection have been used as lithographic technologies utilizing an electron beam. In the variable shaping, exposures of arbitrary rectangular pattern are performed through electron beam deflection. On the other hand, in the partial cell projection, repeated portions of desired pattern are exposed by using cell masks. In these techniques, stencil masks several dozen times as large as the wafer are used as the exposure masks. For example, the maximum exposure area on a wafer subjected to the pattern exposure is a square area having sides of the order of 5 µm in length. These techniques, however, have a problem of lower throughput. To solve this problem, a technique is recently proposed in which the beam diameter of the electron beam on the mask is increased to 1 mm or so, and a stencil mask or a membrane mask four times as large as the wafer is used as the exposure mask. In this technique, the maximum exposure area on a wafer is, for example, a square area having sides of 250 µm in length.

With the adoption of such techniques, there is proposed another technique, in which an exposure mask is formed as a plurality of defined masks corresponding to the entire pattern of the chip (device) to be formed on the wafer, and the defined masks are subjected to electron beam cell projections. Before that, the defined masks used to be formed for only those repeated portions.

In such an improved technique, pattern exposures onto a chip having sides of e.g. 20 mm are performed with the electron beam set at approximately 1 mm in beam diameter on the mask. Besides, the chip area is defined into an 80 by 80 matrix to obtain 6400 defined areas of square shape on the wafer. Each of the defined areas has sides of 250 µm in length, and is subjected to approximately ¼ demagnified projection.

Accordingly, 6400 defined masks each having sides approximately four times those of the defined areas, or of 1 mm, are formed and arranged to constitute an exposure mask. Then, the electron beam emitted from an electron source, having a beam diameter of approximately 1 mm is projected to one of the defined masks. Thereby, the electron beam past the defined mask is transcribed to the wafer, applying cell projection to the defined mask.

Subsequently, such cell projection is successively performed on all the defined masks so that the whole pattern in the exposure mask can be transcribed to the wafer to perform the exposure of the entire chip area.

FIG. 1A is a sectional view showing a conventional membrane mask. FIG. 1B is a sectional view showing a conventional stencil mask.

As shown in FIG. 1A, a conventional membrane mask 100 has an SiN (silicon nitride) substrate 101 of required thickness. A laminated thin film 102 of 30–50 nm in thickness, composed of W (tungsten) and Cr (chromium) films of required pattern is formed on the SiN substrate 101. On the surface of the SiN substrate 101 is integrally formed a reinforcing frame 103 of matrix form. The reinforcing frame 103 is made of Si, and has a thickness of the order of 750 µm. Each matrix area constitutes a defined mask.

On the other hand, as shown in FIG. 1B, a conventional stencil mask 200 has an Si substrate 201 of required thickness, etched or otherwise processed to form recesses 202 in a matrix arrangement. A thin portion 203 formed at the bottom of each recess 202 constitutes a defined mask. Each defined mask (thin portion) 203 has pattern openings 204 of predetermined configuration. The silicon substrate 201 forms frame portions 205 between the recesses 202.

Now, in the partial cell projection technique using the conventional exposure mask of a several dozen magnification, the stencil mask serving as the exposure mask uses an Si substrate having a thickness of the order of 10–20 µm. Meanwhile, the stencil mask to be used as the 4-time-exposure mask in the improved technique needs to form finer patterns, and therefore requires to be reduced to 2 µm or so in thickness with respect to the thickness of the Si substrate. The thinning lowers the mechanical strength of the stencil mask. Therefore, the possibility of mask defects in the mask fabrication rises to make a defect-free exposure mask difficult to fabricate.

Moreover, in the technique of using defined masks, the plurality of defined masks constituting a stencil mask require that not only the patterns for those repeated portions but also the entire chip pattern be defined into the split patterns having a plurality of different patterns. This means easier production of mask defects as compared to the case of fabricating the exposure mask of the order of a several dozen magnification for forming identical repeated patterns. As a result, it becomes difficult to form all the defined masks without any defect.

For such defective membrane mask and stencil mask, pattern repair technologies used for photomasks of optical exposure system are difficult to apply without loss of the function as an exposure mask. Such pattern repair technologies include a focused ion beam (FIB) method in which pattern repairs are carried out by focusing an ion beam onto a metal thin film, such as a chromium film, constituting the mask pattern. Accordingly, the defective exposure masks are unusable, and they require re-fabrication. This results in a problem that the exposure masks drop in production yield, and then rise in fabrication costs.

SUMMARY OF THE INVENTION

An object of the present invention is to provide an electron beam exposure mask which makes it possible to perform electron beam exposures of required pattern even when some of its defined masks are defective, thereby allowing a substantial improvement in mask production yield. Another object of the present invention is to provide an electron beam exposure method and an electron beam exposure apparatus in which such an exposure mask is used to enable exposures of required pattern. Still another object of the present invention is to provide a device fabrication method which allows the fabrication of semiconductor devices and the like through the use of such an electron beam exposure method.

An electron beam exposure mask according to the present invention comprises a main mask having a plurality of first defined masks, and one or more compensation masks having one or more non-defective second defined masks. Each second defined mask has a pattern configuration to be formed in a defective among the first defined masks.

In electron beam exposures by using such an electron beam exposure mask, even when some of the first defined masks are defective, the defective defined masks can be replaced with the non-defective second defined masks for pattern exposure. Therefore, all the defined masks in the main mask need not be composed of non-defective defined masks alone. This eliminates the need to fabricate a main mask consisting of non-defective defined masks. Accordingly, the exposure mask is improved in substantial production yield, whereby the turnaround time of the exposure mask can be reduced for lower costs.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENT

Figure 2:
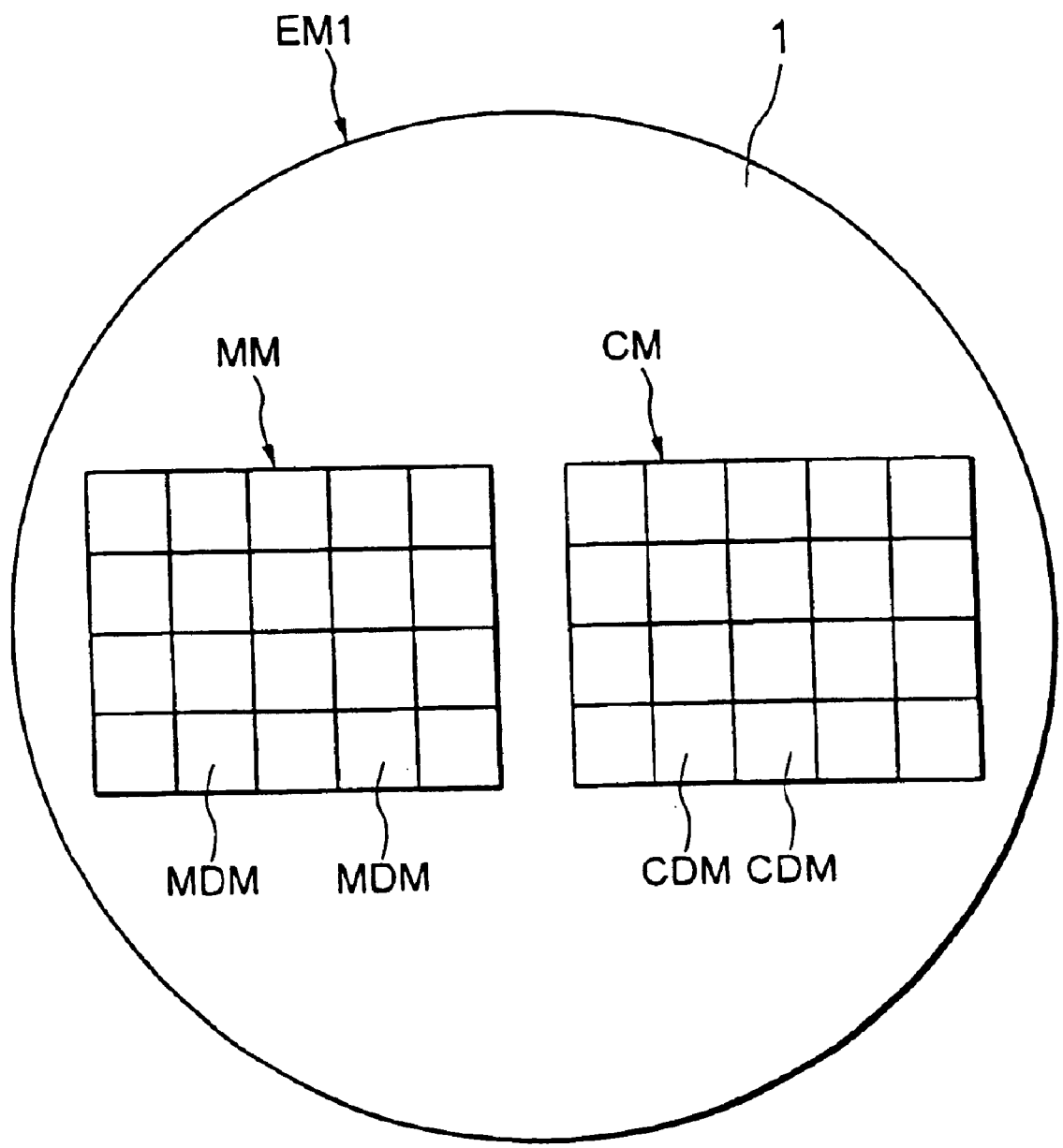
FIG. 2 is a plan view showing the electron beam exposure mask according to a first embodiment of the present invention.

Hereinafter, embodiments of the present invention will be described in detail with reference to the accompanying drawings. FIG. 2 is a plan view showing the electron beam exposure mask according to a first embodiment of the present invention.

An exposure mask (stencil mask) EM1 according to the first embodiment comprises a circular silicon substrate 1 serving as a mask substrate. On the silicon substrate 1 are arranged a main mask MM and a compensation mask CM. The main mask MM includes 6400 defined masks MDM obtained by defining a single chip into a 80 by 80 matrix, or more. Arranged in the compensation mask CM are as many defined masks CDM as the defined masks MDM. Incidentally, for the sake of simplicity, FIG. 2 shows the main mask MM and the compensation mask CM composed of fewer defined masks MDM and CDM.

Figure 1A:
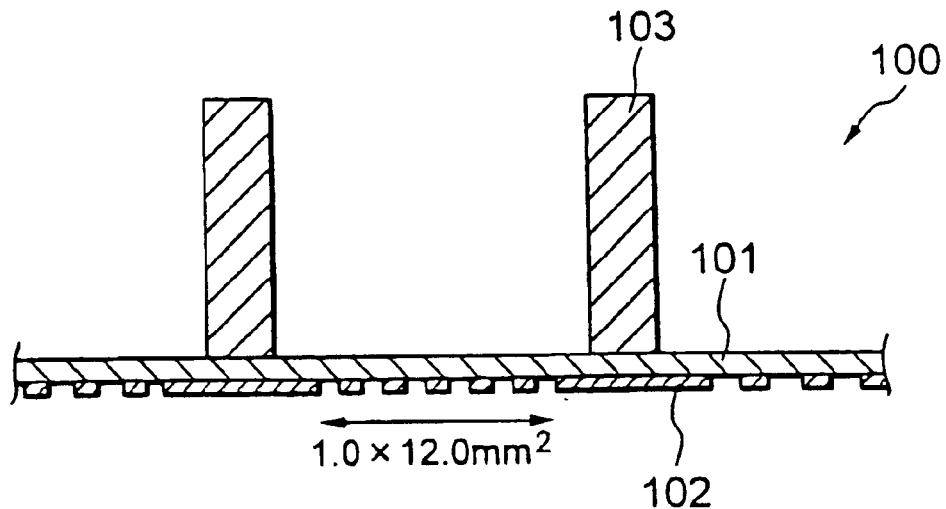
FIG. 1A is a sectional view showing a conventional membrane mask.
Figure 1B:
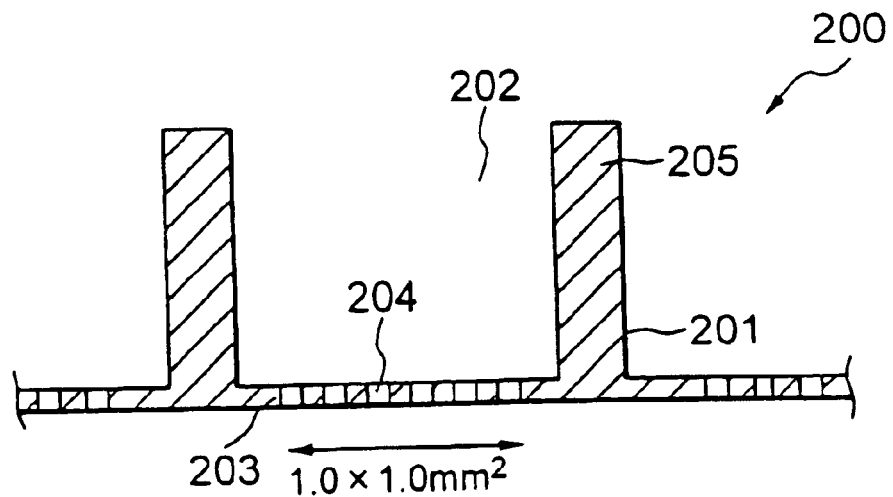
FIG. 1B is a sectional view showing a conventional stencil mask.

The defined masks MDM and CDM each have the shape of a 1-mm square corresponding to the beam diameter of the electron beam. As in the conventional stencil mask shown in FIG. 1B, the Si substrate 1 of required thickness is etched or otherwise processed to form recesses in matrix arrangements. A thin portion formed at the bottom of each recess constitutes a defined mask. Each of the defined masks has pattern openings of predetermined configuration. The silicon substrate forms frame portions of matrix configuration between the recesses.

The pattern exposure of a single chip requires e.g. 6400 defined masks MDM, which are arranged as a block on one region of the silicon substrate 1 to constitute the main mask MM. Similarly, 6400 defined masks CDM are arranged as another block on the other region of the silicon substrate 1 to constitute the compensation mask CM.

The main mask MM and the compensation mask CM have such a relationship that their defined masks MDM and CDM corresponding to each other on a one-on-one basis are provided with the same patterns and formed in the same arrangement.

Figure 3:
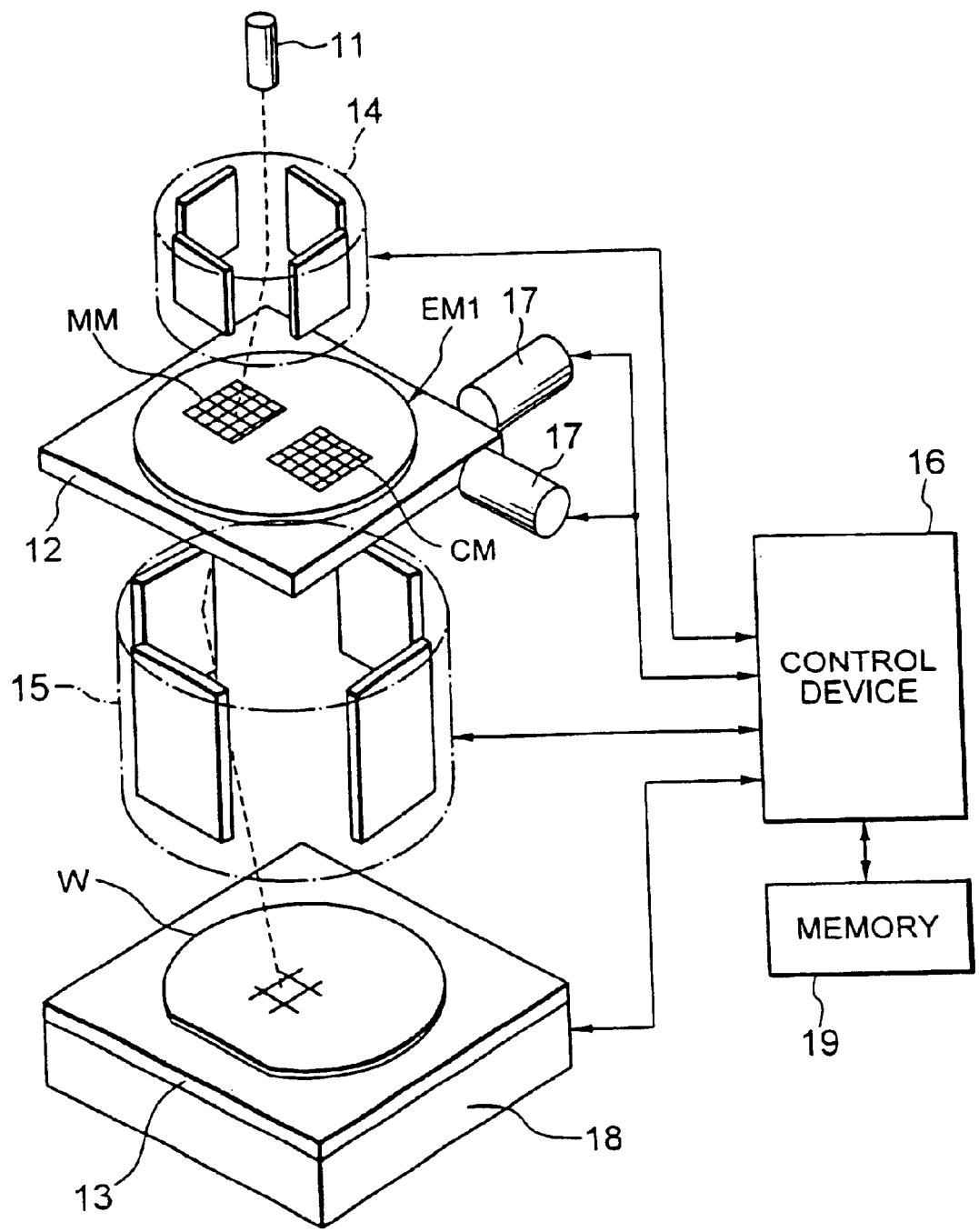
FIG. 3 is a conceptual block diagram showing an electron beam exposure apparatus using an exposure mask EM1.

FIG. 3 is a conceptual block diagram showing an electron beam exposure apparatus using the exposure mask EM1.

This electron beam exposure apparatus comprises an electron gun 11, a mask stage 12, and a wafer stage 13. The electron gun 11 emits an electron beam EB. The mask stage 12 can hold the exposure mask EM1 placed thereon and move the same in planar, or X and Y directions. The wafer stage 13 can hold a semiconductor wafer W placed thereon and move the same in planar X and Y directions. The electron beam EB emitted from the electron gun 11 is projected onto the exposure mask EM1. The wafer W is exposed to the electron beam past the exposure mask EM1.

The electron beam exposure apparatus also comprises a first optical system 14 and a second optical system 15. The first optical system 14 deflects the electron beam emitted from the electron gun 11 to planar X and Y directions so as to change the projected position of the electron beam with respect to the exposure mask EM1 on the mask stage 12. The second optical system 15 deflects the electron beam past the exposure mask EM1 to planar X and Y directions so as to change the projected position of the electron beam with respect to the surface of the wafer W on the wafer stage 13. The first and second optical systems 14 and 15 are controlled by a control device 16. The first optical system 14 makes it possible to project the electron beam EB onto any of the defined masks MDM and CDM arranged on the exposure mask EM1. The second optical system 15 allows the electron beam EM past the exposure mask EM1 to be projected onto any location on the waver W.

The mask stage 12 and the wafer stage 13 are provided with stage actuators 17 and 18, respectively, to be controlled by the control device 16. These stage actuators 17 and 18 change the plan positions of the exposure mask EM1 and the wafer W, respectively. The control unit 16 is also connected with a memory 19. Recorded in the memory 19 are, as will be seen later, the addresses of the defined masks MDM and CDM which constitute the main mask MM and the compensation mask CM, respectively. The control device 16 then reads the addresses from the memory 19 to control the first and second optical systems 14, 15 and the stages 12, 13.

Now, description will be given of the method of applying a chip pattern onto a wafer W through electron beam exposures in the electron beam exposure apparatus shown in FIG. 3 by using the exposure mask EM1 according to the first embodiment shown in FIG. 2.

Initially, the exposure mask EM1 is placed on the mask stage 12 in the electron beam exposure apparatus. In addition, a wafer W consisting of a silicon or other semiconductor substrate is placed on the wafer stage 13. In this connection, the wafer W has an electron beam resist (not shown) applied on its surface.

Next, the control device 16 controls the stage actuators 17 and 18 to set the exposure mask EM1 and the wafer W at predetermined positions with respect to the optical axis of the electron gun 11.

Then, the electron gun 11 emits an electron beam EB, and the electron beam EB is deflected in the first optical system 14. The electron beam EB is projected onto a defined mask MDM for the first exposure.

Projected on this defined mask MDM, the electron beam EB is deformed into a beam configuration patterned by the pattern openings formed in the defined mask MDM, and then deflected in the second optical system 15. The electron beam EB is projected onto the surface of the wafer W. As a result of this, the electron beam resist formed on the surface of the wafer W undergoes exposure.

Incidentally, in these steps, the control device 16 controls the focus positions of the projection lens in the first optical system 14 and the objective lens in the second optical system 15. Therefore, the pattern of the defined mask MDM is brought into focus on the surface of the wafer W for one-shot exposure.

Then, the first optical system 14 deflects the electron beam EB to project the same onto the defined mask MDM for next exposure. Besides, the second optical system 15 deflects the electron beam EB past that defined mask MDM to project the same onto the surface of the wafer W. Thereby, the pattern of the present defined mask is exposed in one shot onto the surface of the wafer W, next to the area exposed through the previous defined mask.

In this way, the step for successively exposing the patterns of the plurality of defined masks MDM onto the surface of the wafer W is repeated, 6400 times in the case of this embodiment, to expose the pattern of a single chip onto the wafer surface.

Figure 4:
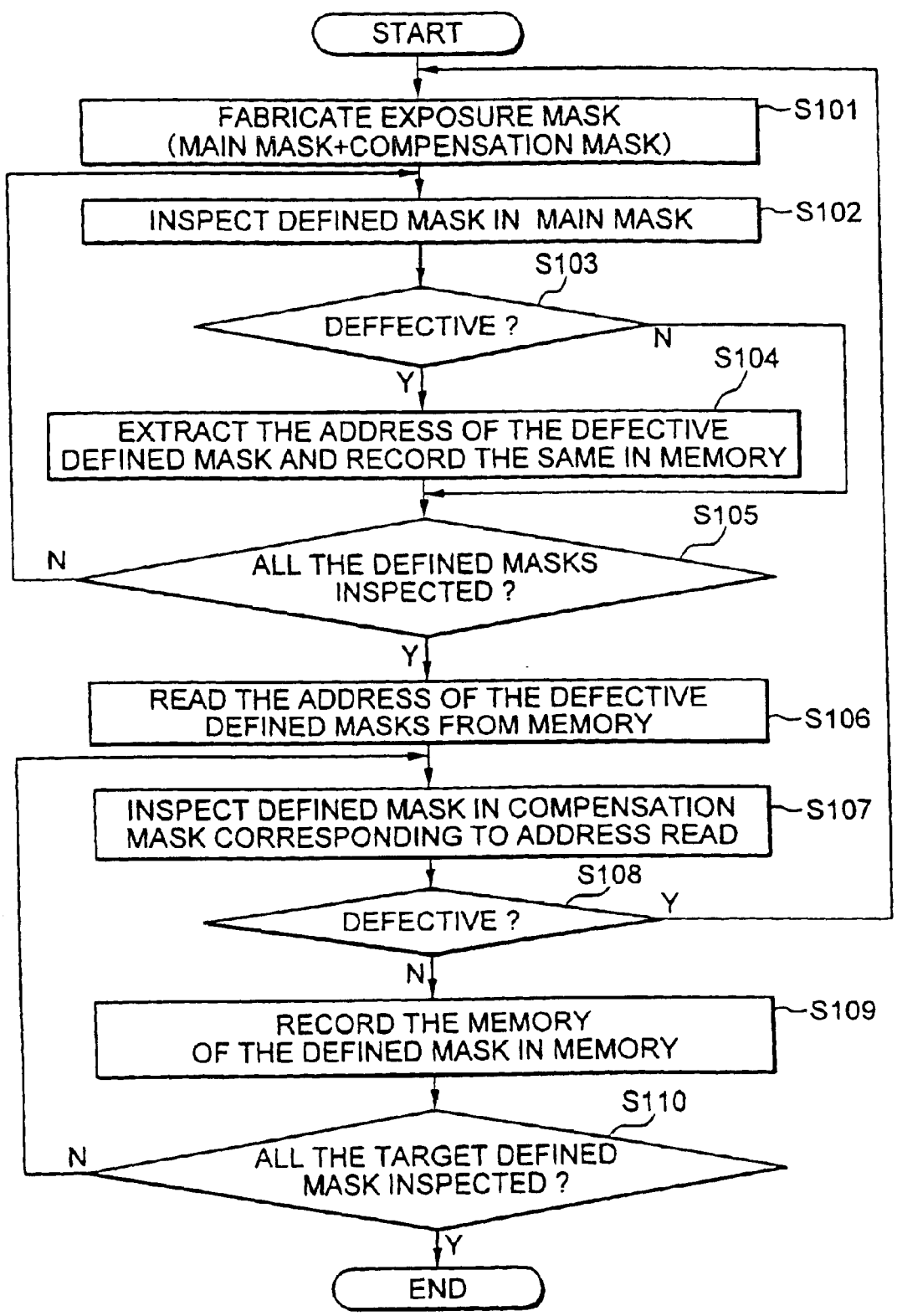
FIG. 4 is a flowchart showing the steps for inspecting a main mask and a compensation mask.

Note that the method described above is used when none of the defined masks MDM is defective. In reality, some of the defined masks MDM are defective as mentioned above. Now, description will be given of the electron beam exposure method for the cases where some of the defined masks MDM are defective. FIG. 4 is a flowchart showing the steps for inspecting the main mask and the compensation mask.

Before electron beam exposures, the exposure mask EM1 is fabricated first (step S101).

Then, with the exposure mask EM1 set on a mask inspection system, the individual defined masks MDM in the main mask MM are subjected to defect inspection (step S102). In this defect inspection, the pattern openings formed in each defined mask MDM are shot by a CCD camera or the like. The pattern openings magnified can be compared with the pattern design to detect the pattern for defects.

Subsequently, a defective defined mask MDM is extracted (step S103), and the address of the defective defined mask MDM is recorded in the memory 19 (step S104). Incidentally, the address may be the x and y coordinates of the defined mask MDM, the serial number of the defined mask MDM assigned thereto in advance, or any other identifying number thereof.

After all the defined masks MDM have been inspected (step S105), the defect inspection is performed on the individual defined masks CDM in the compensation mask CM. In this inspection, the addresses having been identified and recorded in the memory 19 as of defectives in the defect inspection on the defined masks MDM are read out (step S106). Then, only the defined masks CDM corresponding to the addresses are subjected to the defect inspection (step S107). If a defined mask CDM subjected to the inspection is non-defective (step S108), the defined mask CDM is regarded as the defined mask CDM for compensating a defective defined mask MDM, and its address is recorded in the memory (step S109). Here, if the defined mask CDM subjected to the inspection also has a defect, the compensation mask CM cannot be used as the mask for compensation. Therefore, the exposure mask EM1 may be unused, and a new exposure mask is fabricated (step S108, S101).

When all the defined masks CDM subjected to the inspection include no defective (step S110), the defect inspection is completed.

The main mask MM and the compensation mask CM are fabricated, for example, from identical mask prototype patterns. In general, assuming that a single defined mask is defective with a probability P, both defined masks MDM and CDM of an identical pattern are defective with a probability of $P \times P = P^2$. For example, when P is estimated to have a value on the order of 1/10, the probability that both of the defined masks MDM and CDM be defective is 1/100. That is, the probability of such a circumstance becomes extremely low. Therefore, even when the main mask MM includes some defective defined masks MDM, the corresponding defined masks CDM in the compensation mask CM are of extremely high probability to be non-defective normal defined masks. This makes it possible to compensate the defective defined masks MDM in the main mask MM with the non-defective defined masks CDM in the compensation mask CM. Incidentally, if the probability of defectives is estimated to be high, a plurality of identically patterned compensation masks may be fabricated for a further reduction of the probability that the main mask and all the compensation masks be totally defective.

Figure 5:
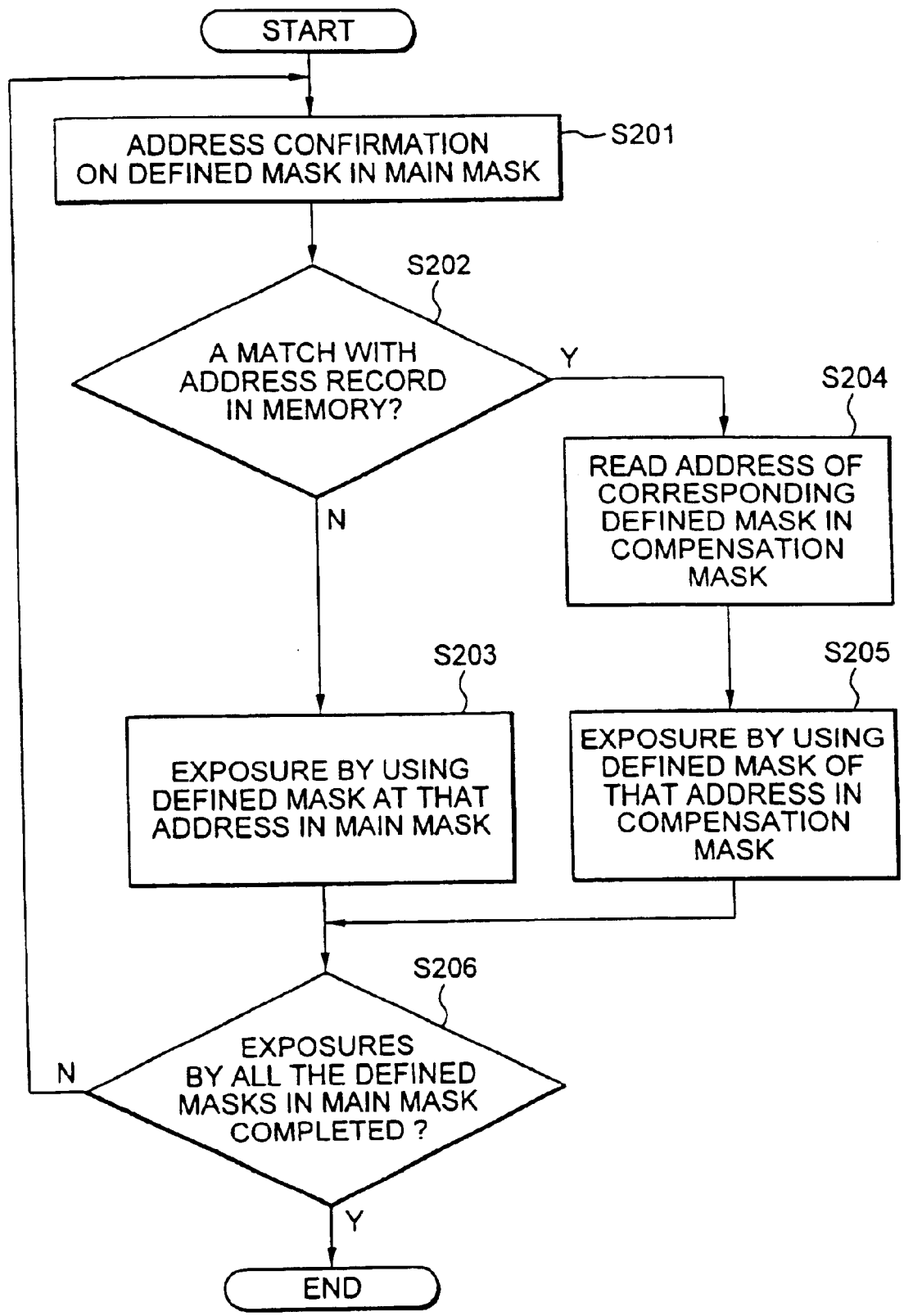
FIG. 5 is a flowchart showing an exposure method using the electron beam exposure mask according to the first embodiment of the present invention.

After the completion of the defect inspection, the exposure of the wafer W is conducted in the electron beam exposure apparatus with the addresses of the defective defined masks MDM and the addresses of the compensating, non-defective defined masks CDM stored in the memory 19. FIG. 5 is a flowchart showing the exposure method using the electron beam exposure mask according to the first embodiment.

As shown in FIG. 5, the control device 16 makes address confirmations (step S201) in performing successive exposures on the defined masks MDM of the main mask MM.

Then, the address is compared with the addresses recorded in the memory 19 (step S202). When the address of the defined mask MDM for an exposure makes no match with the addresses of the defective defined masks recorded in the memory 19, the defined mask MDM is used to perform the exposure (step S203).

On the other hand, if there is an address match, the control device 16 recognizes that the defined mask MDM is a defective defined mask, and reads the address of the defined mask CDM corresponding to that defined mask MDM from the memory 19 (step S204). Based on the read address, the control device 16 controls the mask stage 12 as well as controls the deflection in the first optical system 14 so that the electron beam EB is projected onto the defined mask CDM. In the meantime, the control device 16 controls the second optical system 15 so that the electron beam EB is projected onto the wafer W. Subsequently, an electron beam EB is emitted from the electron gun 11 to carry out the exposure (step S205).

Then, the same processing is completed on each defined mask MDM in the main mask MM (step S206) to end the exposure.

In such an exposure method, those exposures by the defective defined masks MDM in the main mask MM are avoided so that the exposures by the non-defective defined masks CDM in the compensation mask CM are performed.

In this connection, when an exposure by using the compensation mask CM is finished, the control device 16 puts the mask stage 12 back to the previous position to return to the following exposures by the defined masks MDM in the main mask MM. The exposures by the following defective defined masks MDM in the main mask MM are similarly replaced with the exposures by the corresponding defined masks CDM in the compensation mask CM each time. Consequently, the chip pattern exposure by the non-defective defined masks CDM is realized through the use of the main mask MM and the compensation mask CM.

Figure 6:
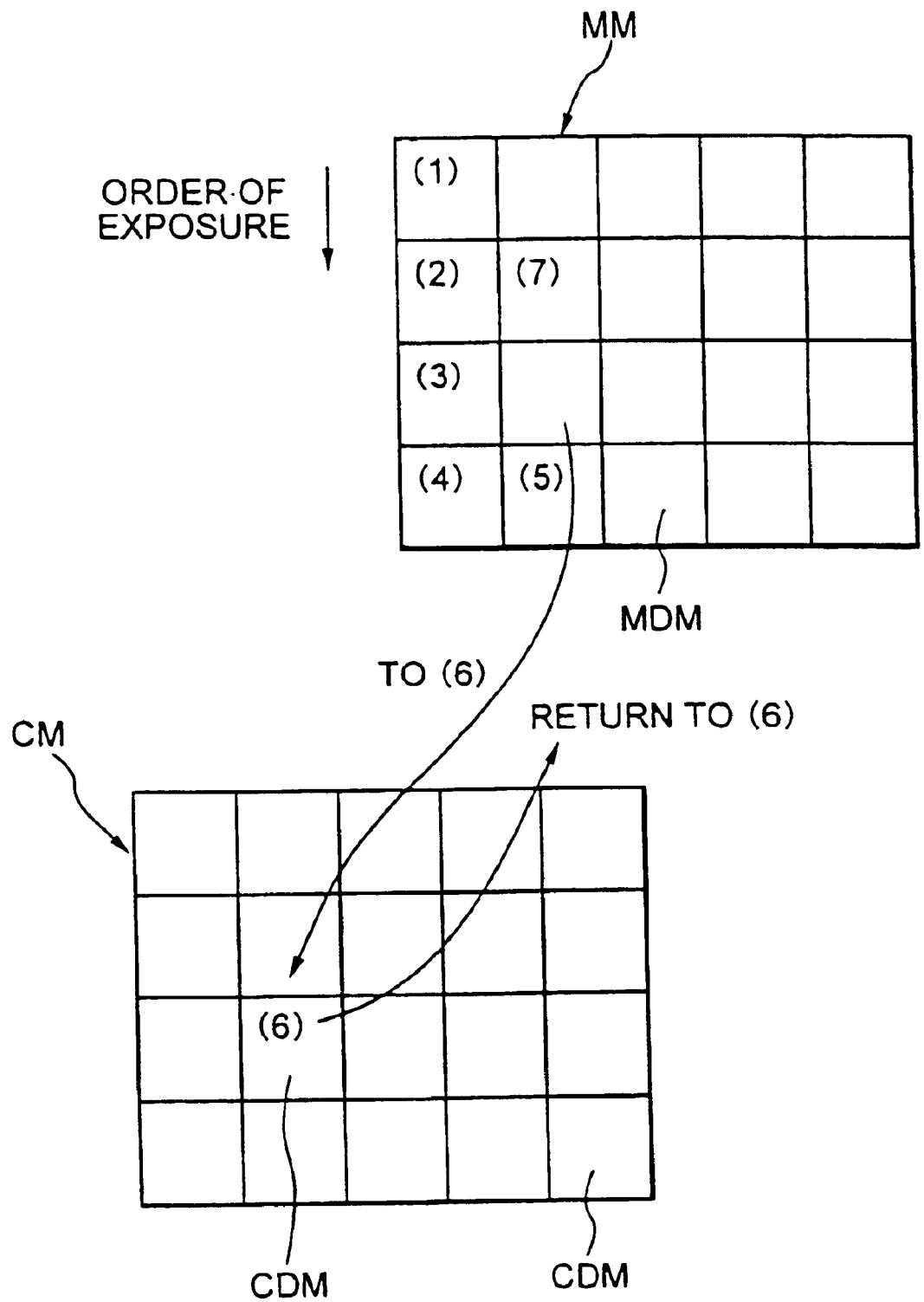
FIG. 6 is a schematic diagram showing the selecting order of defined masks.

FIG. 6 is a schematic diagram showing the selecting order of defined masks. In the method described above, assume, for example, that the defined masks MDM in the main mask MM are successively exposed from (1) to (5) and then the defined mask MDM (6) is found to be defective. Here, the corresponding defined mask in the compensation mask CM, or the non-defective defined mask CDM (6), is used for the exposure. Then, returning to the main mask MM, the same exposure is performed on the next defined mask MDM (7). Subsequently, the exposure is similarly carried on by using defined masks CDM in the compensation mask CM when defined masks MDM in the main mask MM are found to be defective.

As seen from above, according to the first embodiment, the defects in the main mask MM are compensated with the compensation mask CM so that the chip exposure with no defective pattern is realized even when some of the defined masks MDM in the main mask MM are defective. This eliminates the need to fabricate a main mask consisting of defect-free defined masks. Therefore, the exposure mask is improved in substantial production yield, which allows a cut to the exposure mask's turnaround time (TAT) and a reduction in costs.

Note that no distinction needs to be made between the main mask MM and the compensation mask CM in the first place. For example, two masks for making a main mask MM and a compensation mask CM may be formed at the same time and inspected for defective defined masks so that the one with fewer defective defined masks is set as the main mask MM and the other is set as the compensation mask. In this case, the number of replacements between the defined masks MDM and the defined masks CDM becomes smaller, which is advantageous in reducing the total exposure time.

Figure 7:
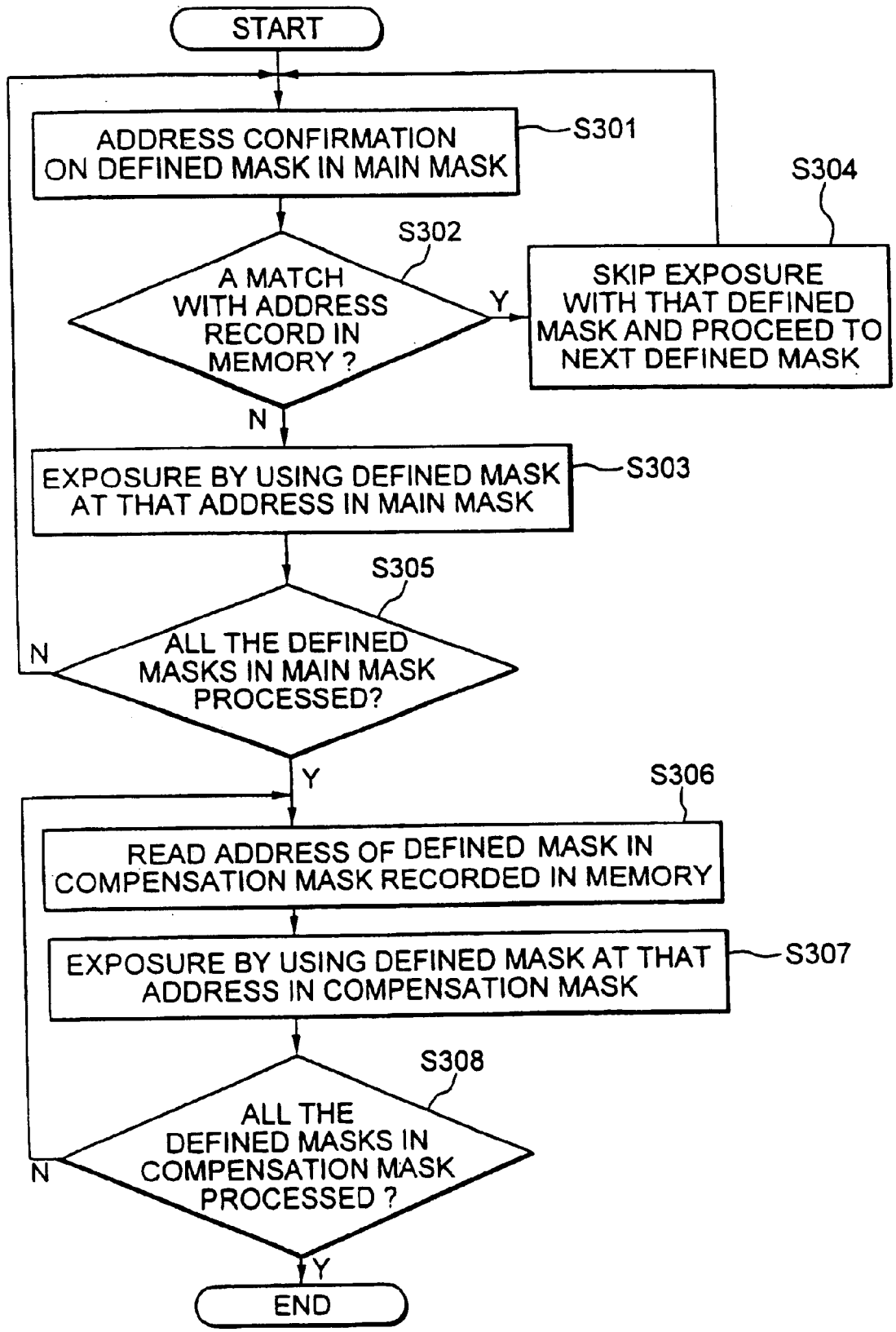
FIG. 7 is a flowchart showing another exposure method using the electron bean exposure mask according to the first embodiment of the present invention.

The first embodiment may also be used for another exposure method. In this method, the exposures by the main mask MM and the exposures by the compensation mask CM are separated from each other on time axis. FIG. 7 is a flowchart showing another exposure method using the electron beam exposure mask according to the first embodiment.

Initially, as shown in FIG. 7, the electron beam exposure apparatus recognizes the addresses of defined masks MDM in the main mask MM when successively performing to-wafer-W exposures on the individual defined masks MDM, as in the method described before (step S301–S303).

Nevertheless, when the control device 16 finds a match between the address of a defined mask MDM and the addresses of the defective defined masks MDM recorded in the memory 19 and thereby recognizes that the defined mask MDM is defective, the control device 16 skips the exposure with the defined mask MDM and jumps to the next defined mask MDM (step S304). That is, in FIG. 6, the exposure by the defined mask (6) is not performed at this point of time.

Then, with none of the exposures by the defective defined masks MDM performed, all the exposures by the non-defective defined masks MDM are completed (step S305).

Next, the control device 16 controls the first optical system 14 so that the electron beam is projected onto the compensation mask CM, and controls the second optical system 15 accompanying the controlling of the first optical system 14. Then, the control device 16 reads the address of the defined mask CDM corresponding to a defective defined mask MDM, i.e. the address of the defined mask CDM corresponding to a still-unexposed defined mask MDM, from the memory (step S306).

Subsequently, an electron beam is projected onto the defined mask CDM at the read address for exposure (step S307). Needless to say, the control device 16 simultaneously controls the wafer stage 13 so that the exposure is applied to an unexposed area on the wafer W.

Then, all the target-defined masks CDM in the compensation mask CM undergo the processing to complete the exposures (step S308). It is that the areas on the surface of the wafer W, not having been exposed by using the main mask MM are exposed by those defined masks CDM in the compensation mask CM. This consequently realizes the chip pattern exposure by the non-defective defined masks CDM.

In this exposure method, the main mask MM and the individual defined masks CDM in the compensation mask CM have only to be arranged within the deflection range of the electron beam EB by the first optical system 14, so that the mask stage 12 need not be controlled in the exposures by using the main mask MM to replace defective defined masks with defined masks CDM in the compensation mask CM each time. As a result, the moving time of the mask stage 12 upon the defined mask replacements can be omitted to reduce the exposure time.

Figure 8:
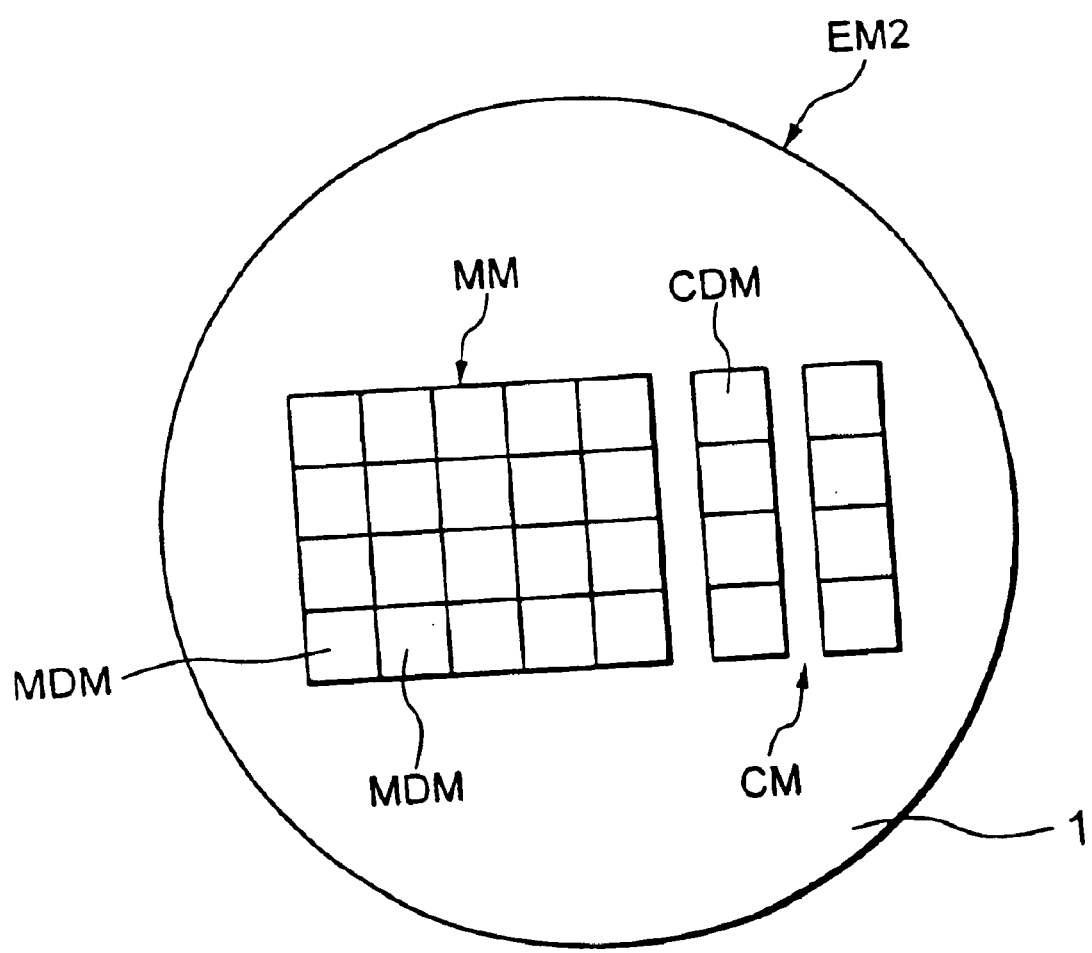
FIG. 8 is a plan view showing the electron beam exposure mask according to a second embodiment of the present invention.

Now, description will be given of a second embodiment of the present invention. FIG. 8 is a plan view showing an electron beam exposure mask according to the second embodiment of the present invention.

As in the first embodiment, the exposure mask (stencil mask) EM2 according to the second embodiment has a main mask MM formed on a silicon substrate 1. The main mask has a required number of defined masks MDM arranged therein. The configuration and arrangement of this main mask MM are the same as those of the main mask MM in the exposure mask EM1. Moreover, a compensation mask CM comprising a predetermined number of defined masks CDM is arranged in an area adjacent to the main mask MM. The defined masks CDM in the compensation mask CM of the second embodiment, being smaller in number as compared to the defined masks MDM of the main mask MM, are arranged corresponding to only a part of the defined masks MDM. That is, only the defined masks corresponding to those defined masks MDM having a higher possibility of being defective among all the defined masks MDM are arranged to constitute the compensation mask CM.

Such an exposure mask EM2 can be fabricated, for example, by the following manner. Initially, a single main mask MM is fabricated. The defined masks MDM in the main mask MM are subjected to the same inspection as that in the first embodiment to detect defective defined masks MDM. Then, the defective defined masks MDM are selected to constitute the compensation mask CM, and the main mask MM and the compensation mask CM are simultaneously formed anew on another silicon substrate. In this case, a plurality of main masks MM may be formed before the inspection on the defined masks MDM in the individual main masks MM so that those defined masks making a defective more often are selected to constitute the compensation mask. This forming method can fabricate an exposure mask EM2 that has the compensation mask CM comprising defined masks CDM with high probabilities of compensating the defective defined masks MDM in the main mask MM.

Moreover, when there is a sufficient space for the compensation mask CM, a plurality of identical defined masks CDM may be formed for defined masks with higher probabilities of being defective, e.g., defined masks with greater opening ratios and defined masks with stricter dimensional precision. This can increase the probability of avoiding all the defined masks CDM from being defective, which is advantageous in fabricating an effective compensation mask CM. In this case, a grading approach may also be adopted in which defined masks having higher possibilities of being defective each are formed more in number than defined masks with lower possibilities.

The electron beam exposure method by using the exposure mask EM2 according to the second embodiment is basically the same as the one using the first embodiment in that the exposure mask EM2 is subjected to the defect inspections before the electron beam exposures. The addresses of defective defined masks MDM in the main mask MM are recorded into the memory 19, and the addresses of the defined masks CDM corresponding to the defective defined masks MDM are recorded into the memory 19 as well.

Then, in the electron beam exposure apparatus, the defined masks MDM are successively subjected to the to-wafer exposure. Here, when the control device 16 recognizes the defective defined masks MDM from the addresses stored in the memory 19, it reads the addresses of the corresponding defined masks CDM from the memory 19. The control device 16 then controls the first and second optical systems 14 and 15 to use the defined masks CDM at the addresses for exposure.

As a result, the exposures are performed with the non-defective defined masks CDM in the compensation mask CM replacing the defective defined masks MDM in the main mask MM. It follows that a chip pattern exposure with defect-free defined masks is realized through the use of the main mask MM and the compensation mask CM.

Note that this exposure method may also adopt the method as shown by the flowchart of FIG. 5, in which a defective defined mask MDM recognized is replaced with a defined mask CDM for exposure each time. Moreover, as shown by the flowchart of FIG. 7, exposures may be performed on all the non-detective defined masks MDM in the main mask MM before those unexposed parts are exposed with the defined masks CDM in the compensation mask CM.

According to the present embodiment, non-defective defined masks CDM of the compensation mask CM need not be fabricated for those defined masks MDM of relatively simple pattern, having lower possibilities of being defective among the plurality of defined masks MDM constituting the main mask MM. Therefore, the defined masks CDM constituting the compensation mask CM can be reduced in number to allow a reduction of the area required for the fabrication of the compensation mask CM. This allows the miniaturization of the exposure mask, which is particularly advantageous in constituting an exposure mask having a main mask of greater area, comprising a large number of defined masks.

Figure 9:
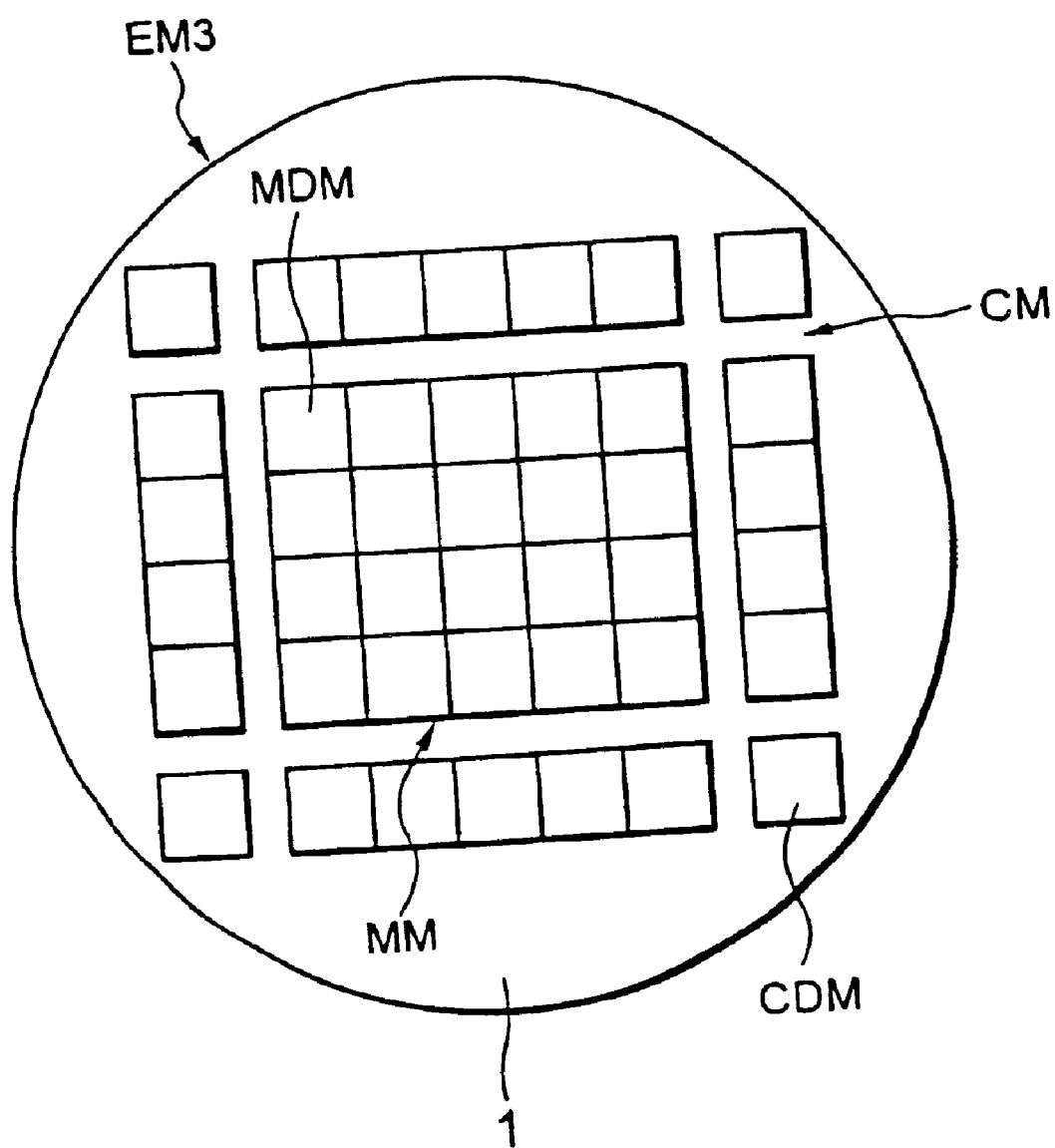
FIG. 9 is a plan view showing the electron beam exposure mask according to a third embodiment of the present invention.

Now, description will be given of a third embodiment of the present invention. FIG. 9 is a plan view showing an electron beam exposure mask according to the third embodiment of the present invention.

As in the first embodiment, the exposure mask (stencil mask) EM3 according to the third embodiment has a main mask MM formed on a silicon substrate 1, the main mask MM having a required number of defined masks MDM arranged therein. The main mask MM has the same configuration and arrangement as those of the main mask MM in the exposure mask EM1. Besides, a compensation mask CM comprising a predetermined number of defined masks CDM is arranged in the areas around the main mask MM. As in the second embodiment, the defined masks CDM of the compensation mask CM in the third embodiment are smaller in number as compared to the defined masks MDM of the main mask MM. The defined masks CDM are thus arranged corresponding to only a part of the defined masks MDM. That is, only the defined masks corresponding to those defined masks MDM having a higher possibility of being defective among all the defined masks MDM are selected and arranged to constitute the compensation mask CM.

Note that in the third embodiment, the defined masks CDM are placed near the corresponding defined masks MDM. In other words, the defined masks CDM are arranged so that the distances between defective defined masks MDM and the defined masks CDM compensating the same become as short as possible.

Such an exposure mask EM3 can be fabricated in the same manner as in the second embodiment. Thereby is fabricated an exposure mask EM3 that has the compensation mask CM composed of defined masks CDM with higher probabilities of compensating the defective defined masks MDM in the main mask MM.

The electron beam exposure method by using the exposure mask EM3 according to the third embodiment is the same as the one using the second embodiment, and therefore detailed description thereof will be omitted here. The electron beam exposure method using the third embodiment may also adopt the method as shown by the flowchart of FIG. 5, in which a defective defined mask MDM recognized is replaced with a defined mask CDM for exposure each time. Moreover, as shown by the flowchart of FIG. 7, exposures may be performed on all the non-detective defined masks MDM in the main mask MM before those unexposed parts are exposed with the defined masks CDM in the compensation mask CM.

According to the present embodiment, the deflection control to the electron beam EB can be made faster even in the case of the exposure method in which defined masks MDM of the main mask MM are replaced with defined masks CDM of the compensation mask CM each time, for the defined masks CDM are arranged near the defined masks MDM to be replaced. Moreover, as in the second embodiment, there is no need in the present embodiment to fabricate non-defective defined masks CDM of the compensation mask CM for those defined masks MDM of relatively simple pattern, having lower possibilities of being defective among the plurality of defined masks MDM constituting the main mask MM. This reduces the number of defined masks constituting the compensation mask and the area required for the fabrication of the compensation mask, allowing the miniaturization of the exposure mask.

In the foregoing embodiments, the main mask MM and the compensation mask CM are formed on a single silicon substrate 1. In the first embodiment, however, the main mask MM and the compensation mask CM may be formed on different silicon substrates. The silicon substrates may be then integrated into a single exposure mask by means of another substrate, a supporting plate, or the like.

Moreover, in these embodiments, the exposure mask is a stencil mask composed essentially of a silicon substrate. However, the exposure mask may be constituted as a membrane mask or the like.

The above-described embodiments have dealt with the cases where the exposure technology is used to apply pattern exposures to an electron beam resist formed on the surface of a semiconductor wafer to fabricate a semiconductor device. Thus, the present invention is particularly suitably applied to the fabrication of a semiconductor device including high-technology logic circuit elements and high-technology memory elements. Nevertheless, the present invention is also applicable to the technique for exposing minute wiring circuits and other traces in a semiconductor device.

As described above, according to the present invention, even when some of the defined masks in the main mask are defective, these defective defined masks can be replaced with non-defective defined masks in the compensation mask to achieve pattern exposure. Therefore, all the defined masks in the main mask need not be composed of non-defective defined masks alone. This eliminates the need to fabricate a main mask consisting of non-defective defined masks alone. As a result, the exposure mask is improved in substantial production yield, thereby allowing a cut to the exposure mask's turnaround time and a reduction in costs While there has been described what are at present considered to be preferred embodiments of the invention, it will be understood that various modifications may be made thereto, and it is intended that the appended claims cover all such modifications as fall within the true spirit and scope of the invention.

What is claimed is:

1. An electron beam exposure mask comprising:
a main mask having a plurality of first defined masks; and
one or more compensation masks including one or more non-defective second defined masks each having a pattern configuration which is intended to be formed with a defective first defined mask among said plurality of first defined masks.

2. The electron beam exposure mask according to claim 1, wherein said main mask and at least one compensation mask are arranged on the same substrate.

3. The electron beam exposure mask according to claim 1, wherein said compensation mask includes one or more non-defective third defined masks each having a pattern configuration which is intended to be formed within one of said plurality of first defined masks, regardless of whether there is a defect in said plurality of first defined masks.

4. The electron beam exposure mask according to claim 3, wherein said compensation mask includes a plurality of identically patterned defined masks.

5. The electron beam exposure mask according to claim 3, wherein said second defined masks are arranged adjacent to said main mask.

6. The electron beam exposure mask according to claim 3, wherein said second defined masks are arranged in the periphery of said main mask.

7. The electron beam exposure mask according to claim 1, wherein the electron beam exposure mask constitutes a membrane mask or a stencil mask.

* * * * *